United States Patent
Maeda

(10) Patent No.: US 11,049,987 B2
(45) Date of Patent: Jun. 29, 2021

(54) SOLAR MODULE AND METHOD OF MANUFACTURING THE SAME

(71) Applicant: Panasonic Intellectual Property Management Co., Ltd., Osaka (JP)

(72) Inventor: Masanori Maeda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 228 days.

(21) Appl. No.: 16/226,634

(22) Filed: Dec. 20, 2018

(65) Prior Publication Data
US 2019/0123227 A1  Apr. 25, 2019

Related U.S. Application Data

(63) Continuation of application No. 14/469,758, filed on Aug. 27, 2014, now abandoned, which is a continuation of application No. PCT/JP2012/056150, filed on Mar. 9, 2012.

(51) Int. Cl.
*H01L 31/048* (2014.01)
*B32B 17/10* (2006.01)
*H01L 31/18* (2006.01)

(52) U.S. Cl.
CPC .... *H01L 31/0481* (2013.01); *B32B 17/10623* (2013.01); *B32B 17/10788* (2013.01); *H01L 31/18* (2013.01); *Y02E 10/50* (2013.01)

(58) Field of Classification Search
CPC ................ H01L 31/0481; H01L 31/18; B32B 17/10623; B32B 17/10788; Y02E 10/50
See application file for complete search history.

(56) References Cited

U.S. PATENT DOCUMENTS

| | | | | |
|---|---|---|---|---|
| 6,066,796 A | * | 5/2000 | Itoyama | H01L 31/02008 136/251 |
| 2008/0053516 A1 | * | 3/2008 | Hayes | H01L 31/048 136/251 |
| 2012/0055539 A1 | * | 3/2012 | Kim | H01L 31/0481 136/247 |
| 2013/0206214 A1 | * | 8/2013 | Akaike | H01L 31/0481 136/251 |

FOREIGN PATENT DOCUMENTS

WO  WO-2012014965 A1 * 2/2012 ............. C08L 23/02

* cited by examiner

*Primary Examiner* — Matthew T Martin
(74) *Attorney, Agent, or Firm* — Metrolex IP Law Group, PLLC

(57) ABSTRACT

A solar module includes an encapsulant and solar cells in the encapsulant. The encapsulant includes a colored encapsulant on one side of the solar cells and a transparent encapsulant on the other side of the solar cells. An interface between the colored encapsulant and the transparent encapsulant is located more on the one side than a main surface of the other side of the solar cells and located more on the other side than a center in a thickness direction of the solar cells.

9 Claims, 2 Drawing Sheets

SOLAR MODULE AND METHOD OF MANUFACTURING THE SAME

CROSS REFERENCE TO RELATED APPLICATIONS

This application is a continuation of U.S. application Ser. No. 14/469,758, filed on Aug. 27, 2014, which is a continuation of International Patent Application No. PCT/JP2012/056150, filed on Mar. 9, 2012, the entire contents of all of which are incorporated herein by reference.

BACKGROUND

The invention relates to a solar module and a method of manufacturing the same.

Patent Document 1 proposes use of a white resin sheet as a resin sheet for forming an encapsulant for a solar module. Using the white resin sheet to form a portion of the encapsulant located on the side of a rear surface of a solar cell may increase incident efficiency of light into the solar cell, thereby improving output characteristics of the solar module.

Patent Document 1: Japanese Patent Application Publication No. 2006-332092

SUMMARY OF THE INVENTION

There is a demand to further improve output characteristics of a solar module.

One aspect of the invention improves output characteristics of a solar module.

In a method of manufacturing a solar module according to an embodiment, a laminated body is obtained by arranging a colored resin sheet on one side of a solar cell, and arranging a transparent resin sheet on the other side of the solar cell. A solar module including a colored encapsulant which is located on the one side of the solar cell and formed of the colored resin sheet and a transparent encapsulant, which is located on the other side of the solar cell and formed of the transparent resin sheet, is fabricated by pressurizing the laminated body while heating the laminated body to such a temperature that a storage elastic modulus of the transparent resin sheet is higher than a storage elastic modulus of the colored resin sheet.

A solar module according to an embodiment includes an encapsulant and solar cells. The solar cells are arranged in the encapsulant. The encapsulant includes a colored encapsulant and a transparent encapsulant. The colored encapsulant is on one side of the solar cells. The transparent encapsulant is located on the other side of the solar cells. An interface between the colored encapsulant and the transparent encapsulant is located more on the one side than a main surface of the other side of the solar cells and located more on the other side than a center in a thickness direction of the solar cells.

The embodiments above improve output characteristics of a solar module.

EMBODIMENTS

Figure 1:
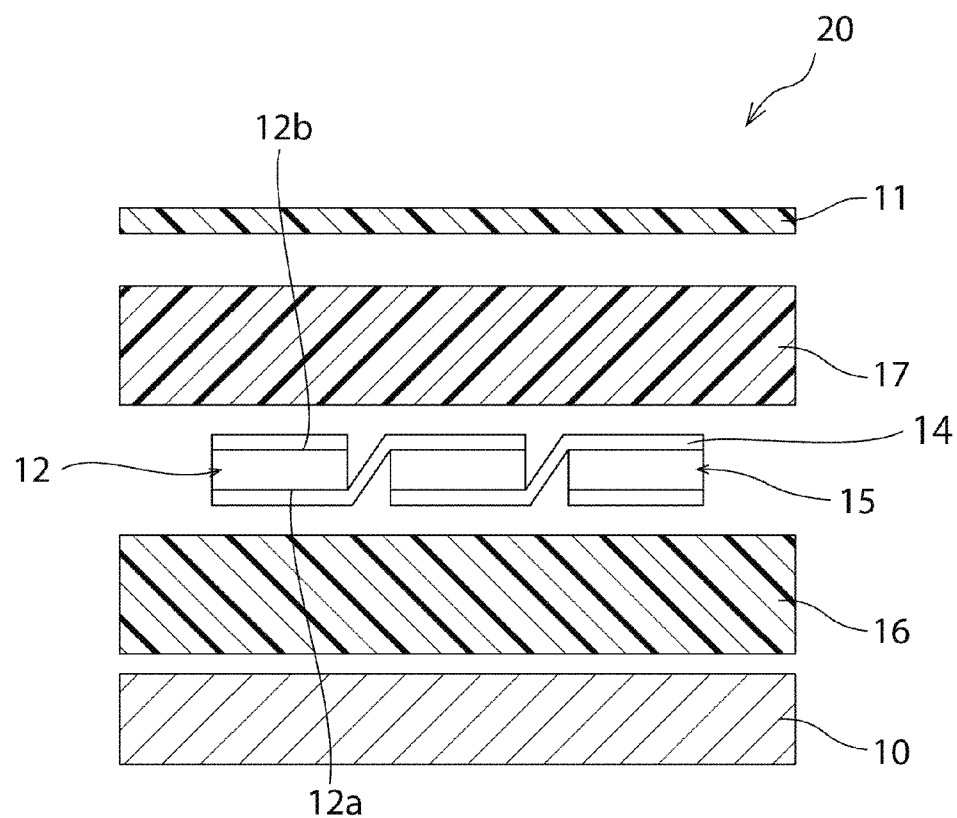
FIG. 1 is a schematic exploded cross-sectional view of a laminated body in an embodiment.

Hereinafter, examples of preferred embodiments are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

Figure 2:
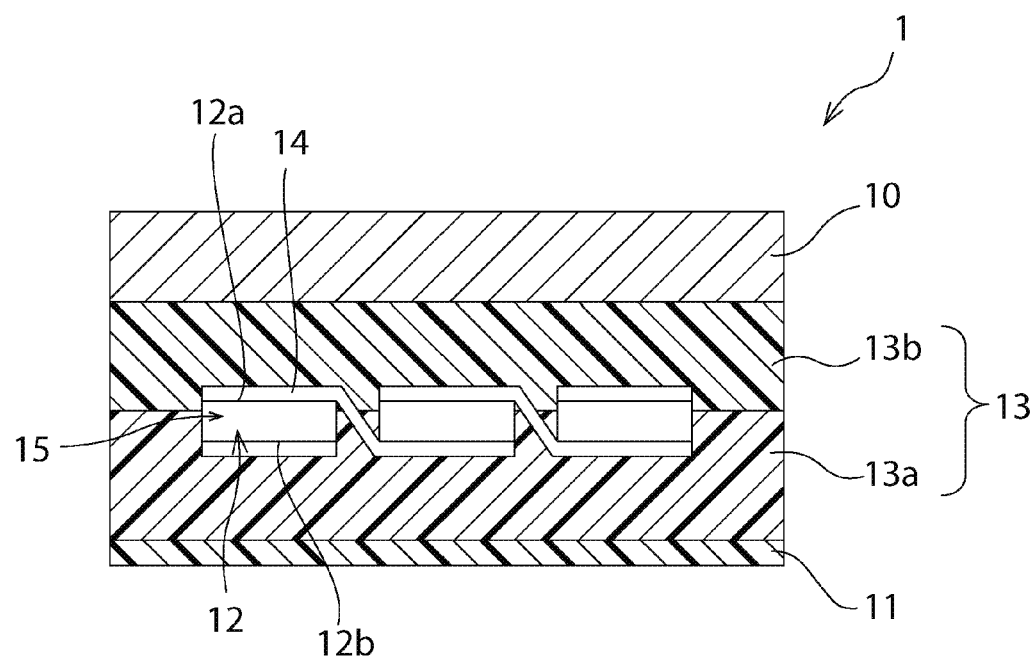
FIG. 2 is a schematic cross-sectional view of a solar module in an embodiment.

In this embodiment, mainly with reference to FIG. 1, one example of a method of manufacturing solar module 1 as shown in FIG. 2 is described.

When solar module 1 is manufactured, first, laminated body 20 as shown in FIG. 1 is fabricated. Specifically, first, solar cells 12 are prepared. Only one solar cell 12 may be prepared. Alternatively, at least one solar cell string 15 including a plurality of solar cells 12 connected by wiring materials 14 may be prepared. Here, an example of preparing solar cell string 15 including a plurality of solar cells 12 which are electrically connected by wiring materials 14 is described.

Solar cell 12 has light-receiving surface 12a and rear surface 12b. Of two main surfaces of solar cell 12, light-receiving surface 12a refers to a main surface which mainly receives light, and other main surface constitutes rear surface 12b. Generally, if an electrode is provided both on light-receiving surface 12a and rear surface 12b, an electrode provided on rear surface 12b has a larger area than an electrode provided on light-receiving surface 12a.

Next, laminated body 20 is fabricated by lamination of first protective material 10, transparent resin sheet 16, a plurality of solar cells 12, colored resin sheet 17, and second protective material 11 in this order. In laminated body 20, colored resin sheet 17 is arranged on the side of rear surfaces 12b of a plurality of solar cells 12. Transparent resin sheet 16 is arranged on the side of light-receiving surfaces 12a of a plurality of solar cells 12.

First protective material 10 is a material configured to protect the side of light-receiving surfaces 12a of solar cells 12. First protective material 10 has translucency. First protective material 10 is made of glass and the like, for example.

Second protective material 11 is a material configured to protect the side of rear surfaces 12b of solar cells 12. For example, second protective material 11 may include a resin sheet or a resin sheet including a reflection layer made of a metal, and the like.

Transparent resin sheet 16 is arranged on light-receiving surfaces 12a of solar cells 12. Here, the "transparent resin sheet" is a resin sheet which contains substantially no pigment or dye and transmits incident light.

Colored resin sheet 17 is arranged on rear surfaces 12b of solar cells 12. Here, a "colored resin sheet" is a resin sheet, which includes a pigment or a dye. Colored resin sheet 17 preferably contains a white pigment made of titania and the like, for example.

Thicknesses of transparent resin sheet 16 and of colored resin sheet 17 are not limited, respectively. Thickness of transparent resin sheet 16 may be the same as or different from that of colored resin sheet 17. Thicknesses of transparent resin sheet 16 and colored resin sheet 17 can be approximately 300 μm to 600 μm, respectively.

Next, a lamination process in which laminated body 20 is laminated by pressurization while being heated is performed. Note that the heating temperature of laminated body 20 in the lamination process can be approximately 50° C. to 150° C., for example. Pressure to be applied to laminated body 20 in the lamination process can be approximately 50 kPa to 100 kPa, for example.

Implementation of the fabrication process and the lamination process of the laminated body described above can complete solar module 1 as shown in FIG. 2. Solar module 1 includes solar cells 12. Specifically, solar module 1 is provided with solar cell string 15 including a plurality of solar cells 12 which are electrically connected by wiring materials 14.

A plurality of solar cells 12 are arranged in encapsulant 13 which is arranged between first protective material 10 and second protective material 11. Encapsulant 13 has colored encapsulant 13a and transparent encapsulant 13b. Colored encapsulant 13a is arranged between second protective material 11 and rear surfaces 12b of solar cells 12. Colored encapsulant 13a is formed of colored resin sheet 17. Thus, colored encapsulant 13a includes a pigment or a dye.

Transparent encapsulant 13b is arranged between light-receiving surfaces 12a of solar cells 12 and first protective material 10. Transparent encapsulant 13b is formed of transparent resin sheet 16.

On second protective material 11 may be provided a terminal box to which wiring materials, electrically connected to a plurality of solar cells 12, are electrically connected. A frame may be provided outside of solar module 1.

Figure 3:
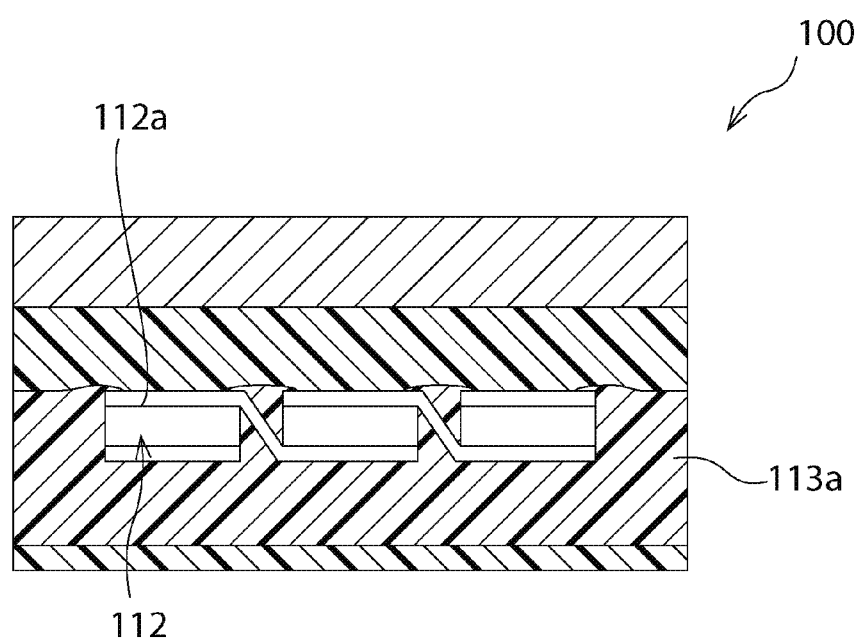
FIG. 3 is a schematic cross-sectional view of a solar module in a reference example.

Incidentally, in general, it is considered that a resin sheet to be arranged on the side of a light-receiving surface of a solar cell and a resin sheet to be arranged on a rear surface are made of a same resin material. For example, a resin sheet formed of an ethylene vinyl acetate copolymer containing a pigment such as titania is arranged on the side of the rear surface of the solar cell, while a resin sheet formed of an ethylene vinyl acetate copolymer containing no pigment is arranged on the side of the light-receiving surface of the solar cell. In this case, however, in the lamination process, a part of the colored resin sheet arranged on the side of the rear surface may come around above the light-receiving surface of the solar cell. As a result, like solar module 100 as shown in FIG. 3, colored encapsulant 113a is located on light-receiving surfaces 112a of solar cells 112. Therefore, output characteristics of the solar module are degraded.

In contrast to this, in the embodiment, a resin sheet, a storage elastic modulus of which at the heating temperature of laminated body 20 in the lamination process is higher than colored resin sheet 17, is used as transparent resin sheet 16. That is to say, at the heating temperature of laminated body 20 in the lamination process, the storage elastic modulus of transparent resin sheet 16 is higher than the storage elastic modulus of colored resin sheet 17. Thus, an interface between colored resin sheet 17 and transparent resin sheet 16 is located more on the side of the rear surface than light-receiving surfaces 12a of solar cells 12 and located more on the side of light-receiving surfaces 12a than a center in a thickness direction of solar cells 12. Therefore, a part of colored resin sheet 17 can be effectively inhibited from coming around above light-receiving surfaces 12a of solar cells 12 in the lamination process. Hence, it becomes possible to manufacture solar module 1 having improved output characteristics.

Now, from a standpoint of inhibiting a colored resin sheet from coming around above a light-receiving surface of a solar cell in the lamination process, it is also possible to perform the lamination process so that an interface of the colored resin sheet and a transparent resin sheet is located more on the side of a rear surface than a center of a thickness direction of the solar cell. In this case, however, light reflected at the interface between the colored resin sheet and the transparent resin sheet easily enters a side of the solar cell. Therefore, efficiency of collecting light at the light-receiving surfaces of the solar cells is reduced. In contrast to this, in the embodiment, the interface between colored resin sheet 17 and transparent resin sheet 16 is located more on the side of light-receiving surfaces 12a than the center in the thickness direction of solar cells 12. Thus, the efficiency of collecting light to light-receiving surfaces 12a of solar cells 12 can be increased. Accordingly, further improved output characteristics can be obtained.

A method of making the storage elastic modulus of transparent resin sheet 16 at the heating temperature of laminated body 20 in the lamination process higher than the storage elastic modulus of colored resin sheet 17 at the heating temperature of laminated body 20 in the lamination process is not limited, in particular. For example, a resin sheet containing cross-linked resin made of an ethylene vinyl acetate copolymer (EVA) and the like is used as colored resin sheet 17, and a resin sheet containing non-cross-linked resin made of a polyolefin such as polyethylene or polypropylene and the like may be used as transparent resin sheet 16. In that case, colored encapsulant 13a contains cross-linked resin and transparent resin sheet 16 contains non-cross-linked resin. Cross-linked resin may have a gel fraction of 50% or higher. Non-cross-linked resin may have the gel fraction of less than 50%. Note that a "gel fraction" shall be measured with the following measuring method. One gram of resin to be measured is prepared. The resin is immersed in 100 ml of xylene at 120° C. for 24 hours. Then, residues are removed from xylene and dried at 80° C. for 16 hours. Then, mass of the residues after being dried is measured. From an obtained result, the gel fraction (%) is calculated based on the following expression (1).

$$\text{(Gel fraction (\%))} = \text{(Mass of residues (g))}/\text{(Mass of resin prior to immersion (g))} \quad (1)$$

From a standpoint of obtaining further improved solar module 1, the storage elastic modulus of transparent resin sheet 16 at the heating temperature of the laminated body 20 in the lamination process is preferably set to 1.5 times and more preferably set to 3.0 times higher than the storage elastic modulus of colored resin sheet 17 at the heating temperature of the laminated body 20 in the lamination process. However, if the storage elastic modulus of transparent resin sheet 16 at the heating temperature of laminated body 20 in the lamination process is too high, solar cells 12 may break up. Therefore, it is preferable that the storage elastic modulus of transparent resin sheet 16 at the heating temperature of laminated body 20 in the lamination process is equal to or less than $1\times10^6$ Pa.

Specifically, the storage elastic modulus of colored resin sheet 17 at the heating temperature of laminated body 20 in the lamination process is preferably equal to or less than $5\times10^5$ Pa, more preferably, equal to or less than $3\times10^5$ Pa, and even more preferably, equal to or less than $1\times10^5$ Pa. It is preferable that the storage elastic modulus of transparent resin sheet 16 at the heating temperature of laminated body 20 in the lamination process is $8\times10^6$ Pa to $5\times10^6$ Pa.

The storage elastic modulus of transparent resin sheet 16 may be higher than the storage elastic modulus of colored resin sheet 17, only at the heating temperature of laminated body 20 in the lamination process. The storage elastic modulus of transparent resin sheet 16 may be higher than the storage elastic modulus of colored resin sheet 17 not only at the heating temperature of laminated body 20 in the lamination process but also at any temperature which is lower than the heating temperature of laminated body 20.

The invention includes a variety of embodiments which are not described herein. For example, a solar cell may be a rear junction solar cell having a first electrode and a second electrode on the side of a rear surface. A solar module may be provided with one solar cell. As described above, the invention includes a variety of embodiments which are not described herein. Therefore, a technological scope of the invention shall be defined only by the invention specific matters according to the claims which are reasonable from the above description.

The invention claimed is:

1. A method of manufacturing a solar module, comprising:
preparing a stacked body in which a colored resin sheet, a solar cell, a transparent resin sheet are stacked in the recited order, in such a manner that the colored resin sheet is provided on one side of the solar cell and the transparent resin sheet is provided on the other side of the solar cell; and
heating and pressurizing the stacked body at such a temperature that a storage elastic modulus of the transparent resin sheet is 1.5 times higher than a storage elastic modulus of the colored resin sheet to obtain a laminated body in which an interface between a colored encapsulant formed from the colored resin sheet on the one side of the solar cell and a transparent encapsulant formed from the transparent resin sheet on the other side of the solar cell is located more toward the one side of the solar cell than a main surface of the other side of the solar cell and located more toward the other side of the solar cell than a center in a thickness direction of the solar cell.

2. The method of manufacturing a solar module according to claim 1, wherein
the colored resin sheet comprises cross-linked resin, and the transparent resin sheet comprises non-cross-linked resin.

3. The method of manufacturing a solar module according to claim 2, wherein
the colored resin sheet comprises an ethylene vinyl acetate copolymer, and the transparent resin sheet comprises a polyolefin.

4. The method of manufacturing a solar module according to claim 1, wherein
the storage elastic modulus of the transparent resin sheet is equal to or less than $1*10^6$ Pa.

5. The method of manufacturing a solar module according to claim 4, wherein
the storage elastic modulus of the colored resin sheet is equal to or less than $5*10^5$ Pa.

6. The method of manufacturing a solar module according to claim 4, wherein
a difference between the storage elastic modulus of the transparent resin sheet and the storage elastic modulus of the colored resin sheet in the pressurizing process is equal or more than $5*10^1$ Pa.

7. The method of manufacturing a solar module according to claim 1, wherein
the temperature is within a range from 50° C. to 150° C.

8. The method of manufacturing a solar module according to claim 1, wherein
the temperature is set to a temperature that the storage elastic modulus of the transparent resin sheet is 3 times higher than the storage elastic modulus of the colored resin sheet.

9. The method of manufacturing a solar module according to claim 3, wherein
the colored resin sheet consists essentially of the ethylene vinyl acetate copolymer, and the transparent resin sheet consists essentially of the polyolefin.

* * * * *